United States Patent
Kyles et al.

(10) Patent No.: US 8,837,467 B2
(45) Date of Patent: Sep. 16, 2014

(54) MULTI-RATE SERIALIZER/DESERIALIZER CIRCUIT WITH BROAD OPERATING FREQUENCY RANGE

(76) Inventors: Ian Kyles, West Linn, OR (US); Xiaoshu Zhao, Lake Oswego, OR (US)

(*) Notice: Subject to any disclaimer, the term of this patent is extended or adjusted under 35 U.S.C. 154(b) by 736 days.

(21) Appl. No.: 12/687,419

(22) Filed: Jan. 14, 2010

(65) Prior Publication Data

US 2011/0170560 A1    Jul. 14, 2011

(51) Int. Cl.
*H04L 12/50* (2006.01)
*H03M 9/00* (2006.01)

(52) U.S. Cl.
CPC .................................... *H03M 9/00* (2013.01)
USPC .......................................................... 370/366

(58) Field of Classification Search
CPC ............. H04J 3/062; H04J 3/07; H04J 3/073; H04J 3/076; H04J 3/18; H04J 3/22; H04J 14/08; H04L 7/0091; H04L 7/0079; H04L 25/05
USPC .................................................. 370/358, 366
See application file for complete search history.

(56) References Cited

U.S. PATENT DOCUMENTS

| | | | |
|---|---|---|---|
| 6,417,790 B1 * | 7/2002 | Fiedler et al. | 341/101 |
| 7,994,950 B1 * | 8/2011 | Lo et al. | 341/101 |
| 2003/0115542 A1 * | 6/2003 | Hwang et al. | 714/798 |
| 2004/0101064 A1 * | 5/2004 | Jenkins et al. | 375/295 |
| 2006/0133809 A1 * | 6/2006 | Chow et al. | 398/66 |
| 2007/0092039 A1 * | 4/2007 | Yang et al. | 375/327 |
| 2009/0052601 A1 * | 2/2009 | Faller et al. | 375/372 |
| 2009/0097605 A1 * | 4/2009 | Farjad-Rad | 375/373 |
| 2009/0323731 A1 * | 12/2009 | Lee et al. | 370/536 |
| 2010/0150290 A1 * | 6/2010 | Kim et al. | 375/371 |

* cited by examiner

*Primary Examiner* — Peter Cheng
(74) *Attorney, Agent, or Firm* — Klein, O'Neill & Singh, LLP (57) ABSTRACT

A serializer and deserializer utilize upsampling and downsampling to operate over a broad range of frequencies. The serializer includes a bit repeater and a high-speed serializer. The bit repeater receives data to be serialized, upsamples the received data, and supplies the upsampled data to the high-speed serializer. The deserializer includes a high-speed deserializer and a downsampler. The high-speed deserializer supplies parallelized data to the downsampler. The downsampler decimates the parallelized data and supplies the decimated data to an output of the deserializer.

16 Claims, 9 Drawing Sheets

MULTI-RATE SERIALIZER/DESERIALIZER CIRCUIT WITH BROAD OPERATING FREQUENCY RANGE

BACKGROUND OF THE INVENTION

The present invention relates generally to serializer/deserializer circuits and, more particularly, to serializer/deserializer circuits operable over a broad frequency range.

Although processing circuitry often processes data in a parallel manner, the data are often communicated between points serially. A serializer circuit is often utilized at a transmission end of a communication link to serialize the data, and a deserializer circuit is often utilized at the reception end to deserialize the data. Bidirectional communication links commonly employ devices that perform both serialization and deserialization, with the device referred to as serializer/deserializer, or more commonly as a serdes.

In some applications, data may be transmitted from one point to another or from one point to any of a number of other points, at different data rates. When the data is transmitted at different data rates, the serdes devices utilized in such a communication link operate at corresponding different frequencies.

Serdes devices commonly include voltage-controlled oscillators, phase detectors, filters, or other circuitry of an analog or quasi-analog nature. These circuits are often tuned for operation at one frequency or a narrow range of frequencies. Accordingly, operating serdes devices over a broad range of frequencies is troublesome, particularly when the maximum frequency is high.

BRIEF SUMMARY OF THE INVENTION

The invention accordingly provides serializer and deserializer circuits with broad operating frequency ranges.

In one aspect the invention provides an integrated circuit including high-speed serializer circuitry configured to operate at a data rate at least a fast as the fastest of a plurality of different selectable data rates, bit repeater circuitry configured to receive data at any of the plurality of different selectable data rates and supply data to the high-speed serializer at the operating rate of the high-speed serializer, high-speed deserializer circuitry configured to operate at a data rate at least a fast as the fastest of the plurality of different selectable data rates, and downsampler circuitry configured to receive data from the high-speed deserializer circuitry at the operating data rate of the high-speed deserializer circuitry and supply data at any of the plurality of different selectable data rates.

In another aspect the invention provides a serializer, including high-speed serializer circuitry configured to operate at a data rate at least a fast as the fastest of a plurality of different selectable data rates, and bit repeater circuitry configured to receive data at any of the plurality of different selectable data rates and supply data to the high-speed serializer at the operating data rate of the high-speed serializer.

In another aspect the invention provides a deserializer, including high-speed deserializer circuitry configured to operate at a data rate at least a fast as the fastest of a plurality of different selectable data rates, and downsampler circuitry configured to receive data from the high-speed deserializer circuitry at the operating data rate of the high-speed deserializer circuitry and supply data at any of the plurality of different selectable data rates.

In another aspect the invention provides a deserializer, including first high-speed deserializer circuitry configured to sample values on a serial input signal at a data rate at least a fast as the fastest of a plurality of different selectable data rates utilizing a first high-speed clock signal and produce first intermediate data signals, second high-speed deserializer circuitry configured to sample values on the serial input signal at a data rate at least a fast as the fastest of the plurality of different selectable data rates utilizing a second high-speed clock signal and produce second intermediate data signals, phase detector circuitry configured to determine a desired phase of the first and second high-speed clock signals, clock synthesizer circuitry configured to produce the first and second high-speed clock signals, where the first and second high-speed clock signals are produced based on a signal from the phase detector, and downsampler circuitry configured to receive the first intermediate data signals at the operating data rate of the first high-speed deserializer circuitry and supply data at any of the plurality of different selectable data rates.

In another aspect the invention provides a method for serialization of data, including receiving parallel data at any of a plurality of different selectable data rates, conditionally repeating the received parallel data to produce repeated data, and transmitting serially the received parallel data or the repeated data at a data rate at least a fast as the fastest of the plurality of different selectable data rates.

In another aspect the invention provides a method for deserialization of data, including demultiplexing at a first data rate received data, conditionally downsampling the demultiplexed received data, and transferring at a second data rate the demultiplexed received data or the downsampled data, where the second data rate is any of a plurality of different selectable data rates and the first data rate is at least a fast as the fastest of the plurality of different selectable data rates.

These and other aspects of the invention are more fully comprehended upon review of this disclosure.

DETAILED DESCRIPTION

Figure 1:
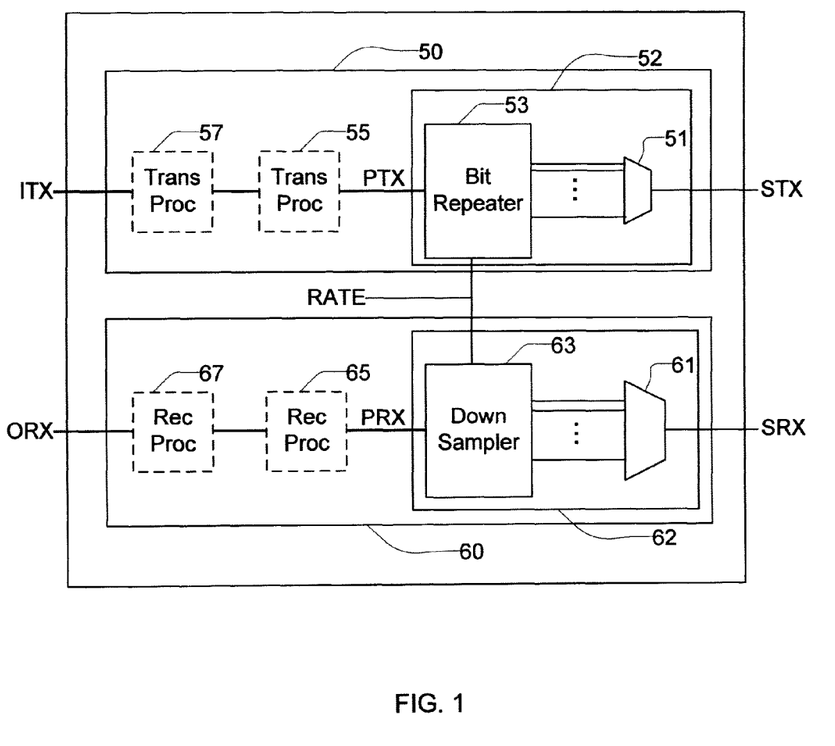
FIG. 1 is a block diagram of an integrated circuit in accordance with aspects of the invention.

FIG. 1 is a partial block diagram of integrated circuitry implemented on a common substrate or alternatively provided in a common package. The integrated circuitry, for example, is configured to perform physical layer communication functions, and may be termed a PHY device. The integrated circuitry includes transmit path circuitry 50 and receive path circuitry 60. As illustrated in FIG. 1, the transmit path circuitry 50 includes transmit processing circuitry blocks 55, 57 and serialization associated circuitry 52, and the receive path circuitry 60 includes deserialization associated circuitry 62 and receive processing circuitry blocks 65, 67.

Generally the transmit path circuitry receives parallel signals for transmission, performs transmission associated processing using the parallel signals for transmission, and serializes the processed parallel signals for serial communication in a communication medium. The transmission associated processing performed, for example, by the transmit processing circuitry blocks 55, 57, may include encoding processing, mapping processing, or other processing. Similarly, the receive path circuitry receives a serial input signal, deserializes the serial input signal to form parallel received signals, and performs receive associated processing using the parallel received signals.

For the circuitry of FIG. 1, the data rate for transmitted and received signals is at a selected data rate, and the selected data rate may be any of a plurality of data rates. For example, in some embodiments, depending possibly on circumstances, data may be transmitted at any of 1.25 Gbits/sec, 2.5 Gbits/sec, or 10 Gbits/sec. In such embodiments, the transmit processing circuitry blocks and the receive processing circuitry blocks operate at corresponding word rates. However, preferably serially switching circuitry in the serialization and deserialization associated circuitry operate at only a single data rate, the highest data rate of the plurality of data rates or some higher rate.

The serialization associated circuitry 52 serializes the processed parallel signals. As illustrated in FIG. 1, the serialization associated circuitry 52 includes a bit repeater 53 and a high-speed serializer 51. Preferably, the high-speed serializer 51 operates at a single data rate or a narrow range of data rates which may be a different, higher, data rate than the data rate of the transmit processing circuitry blocks. The bit repeater 53 therefore adapts the processed parallel signals at the selected data rate to the parallel signals at the data rate of high-speed serializer 51.

In some embodiments, the bit repeater 53 performs this function by upsampling the processed parallel signals by an appropriate factor. As shown in FIG. 1, the upsampling or repetition factor is indicated by a rate control signal RATE, which, for example, may signal a ratio of the data rate of the high speed serializer to the selected data rate. For example, when the selected data rate is 2.5 GHz, the rate control signal RATE may have a value of 2 so that the high-speed serializer 51 operates at 5 GHz, and when the selected data rate is 1.0625 GHz, the rate control signal RATE may have a value of 4 so that the high-speed serializer 51 operates at 4.25 GHz.

Accordingly, the bit repeater 53 receives the processed parallel signals from the transmit processing circuitry blocks 55, 57 at the selected data rate. The bit repeater 53 repeats, or upsamples, the processed parallel signals and produces repeated parallel signals at the serializer data rate. For example, the processed parallel signals may comprise in parallel D0, D1, D2, D3 and the rate control signal RATE may indicate that the selected data rate is one-half the serial data rate. In such an example, the bit repeater generates in parallel D0, D0, D1, D1 followed by D2, D2, D3, D3 in parallel. The high-speed serializer 51 serializes the repeated parallel signals to produce a serial output signal for transmission from the integrated circuitry. The bit repeater 53 and the high-speed serializer 51 operating in combination allow the serialization associated circuitry 52 to perform serialization at a single data rate, which may be greater than data rates of data processed by the transmit processing circuitry blocks.

The deserialization associated circuitry 62 deserializes the serial input signal. As illustrated in FIG. 1, the deserialization associated circuitry 62 includes a high-speed deserializer 61 and a downsampler 63. Preferably, the high-speed deserializer 61 operates at a single data rate or a narrow range of data rates which may be a different, higher, data rate than the data rate of the receive processing circuitry blocks. The downsampler 63 therefore adapts the preferred data rate of the high-speed deserializer 61 to the selected data rate of the parallel received signals by downsampling by an appropriate factor. The downsampling or repetition factor is indicated by the rate control signal RATE, which may, for example, signal the ratio of the data rate of the high speed deserializer to the selected data rate. The high-speed deserializer 61 deserializes the serial input signal to produce parallel deserialized signals. The downsampler 63 downsamples the parallel deserialized signals to produce the parallel received signals for the receive processing circuitry blocks 65, 67 at the selected data rate. The operation of downsampling may also be termed decimation and the downsampler termed a decimator. The downsampler 63 and the high-speed deserializer 61 operating in combination allow the deserialization associated circuitry 62 to perform deserialization at a single data rate, which may be greater than data rates of data processed by the receive processing circuitry blocks.

The transmit processing circuitry blocks may include a FIFO 57 to rate buffer between the parallel signals for transmission and the serialization associated circuitry 52. The FIFO 57 receives the parallel signals for transmission and supplies rate buffered signals. The transmit processing circuitry blocks may also include an encoder 55 to receive the buffered signals from the FIFO 57 and supply the processed parallel signals to the serialization associated circuitry 52. The encoder 55 may encode the buffered signals using, for example, an 8B10B code.

The receive processing circuitry blocks may include an aligner 65 to receive the parallel received signals from the deserialization associated circuitry 62 and supply aligned signals. The aligner 65 searches the parallel received signals for alignment boundaries and shifts the parallel received signals to produce the aligned signals. The receive processing circuitry blocks may also include a decoder 67 to decode the aligned signals, for example, using an 8B10B code, and produce the parallel output signals.

The parallel signals for transmission in the transmit path circuitry 50 may be provided by way of an input bus ITX and may be provided by, for example, a media access controller (MAC) device, which may be an Ethernet MAC device. The serial output signal may be provided by way of an output STX and may be supplied to, for example, a physical medium dependant (PMD) device, which may be an Ethernet PMD device. Operation of the receive path circuitry 60 is essentially complementary to operation of the transmit path circuitry 50. Accordingly, the serial input signal to the receive path circuitry 60, may be provided by way of an input SRX and may be supplied by, for example, a physical medium dependant (PMD) device, which may be an Ethernet PMD device. The parallel output signals may be provided by way of an output bus ORX and may be provided by, for example, a media access controller (MAC) device, which may be an Ethernet MAC device.

Figure 2:
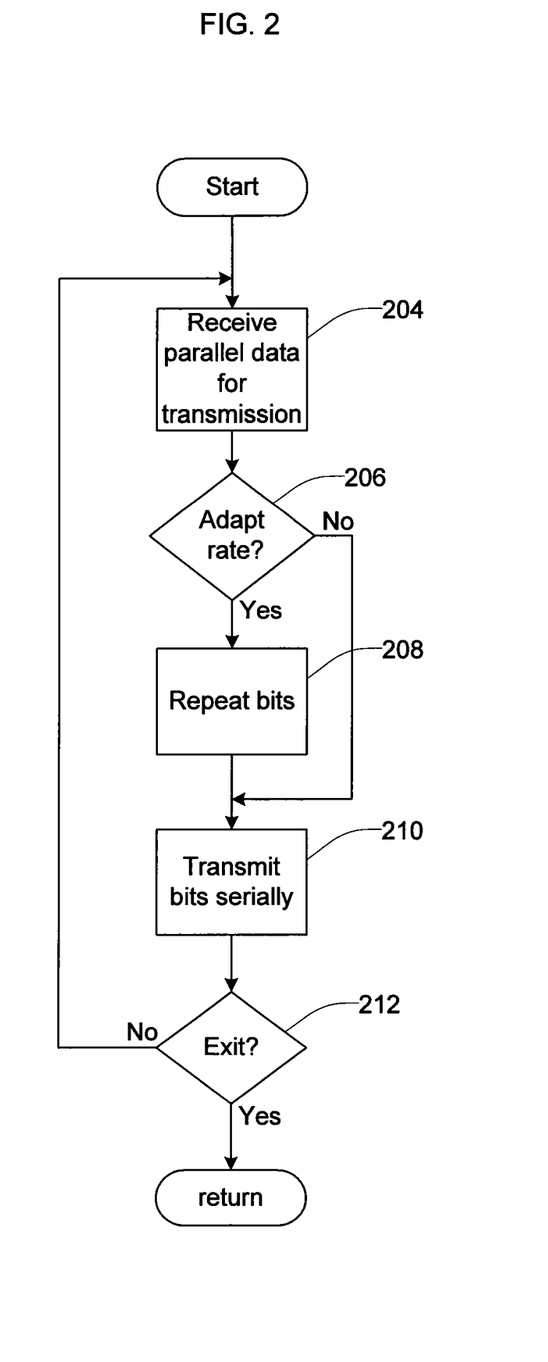
FIG. 2 is a flowchart of a serialization process in accordance with aspects of the invention.

FIG. 2 is a flowchart of a process for serializing data in accordance with aspects of the invention. In various embodiments, the process may be performed by the circuitry of FIG. 1, custom circuitry, programmable circuits, or a combination thereof. In many embodiments, the process is implemented by continuously running circuitry with data flowing through different portions of the circuitry as different times. The process may be initiated, for example, by a signal detector, such as a start-of-frame detector, or by application of power to circuitry performing the process. In a block 204, the process receives parallel data to be transmitted. The parallel data may come from, for example, a communication network switch. The process then continues to a block 206.

In the block 206, the process checks whether it should adapt the data rate. Whether the data rate should be adapted may be based on a control input to the process. For example, a control signal may have a value of one when the data rate is not to be adapted and a larger value when the data rate is to be adapted. If the data rate should be adapted, the process continues to a block 208; otherwise, the process continues to a block 210.

In the block 208, the process repeats bits to adapt the data rate. In one embodiment, the process repeats bits from received parallel data and arranges the repeated bits consecutively. That is, the process groups the repetitions of each bit from the input data so that no other bits are intermingled. The number of times that each bit is repeated may be based on a control input to the process, for example, a control signal used in the block 206 may have a value signaling the number of repetitions. The process then continues to the block 210.

The processing of block 208 may be performed by the bit repeater 53 of the embodiment of FIG. 1. The bit repeater 53 receives the processed parallel signals as groups of associated values, which may be considered to form repeater input words. The bit repeater 53 receives a new repeater input word at regular intervals depending on the selected data rate. Similarly, the bit repeater 53 produces the repeated signals as groups of associated values which may be considered to form repeater output words. The bit repeater 53 produces a new repeater output word at regular intervals depending on the preferred data rate of the high-speed serializer 51. For each repeater input word, the bit repeater 53 produces the repetition factor number of repeater output words.

When the repetition factor, denoted N, is 1, the values in each repeater input word are supplied as is to each repeater output word. A repetition factor of 1 corresponds to the case when the process does not adapt the data rate. When the repetition factor N is an integer greater than 1, the bit repeater 53 produces N copies of each bit of the repeater input words in consecutive bit positions of repeater output words. The repeated bits may wrap over multiple repeater output words. The bit repeater 53 begins processing a repeater input word by placing N copies of the first (to be serialized) bit of the repeater input word in the first (to be serialized) N bits of the first repeater output word supplied to the high-speed serializer 51. Then, N copies of the next bit of the repeater input word are placed in the next N bits of the repeater output word. Placing N copies of the next bit of the repeater input word in the next N bits of the repeater output word continues until all bits of the repeater input word have been copied. When a copy of an input bit has been placed in the last bit of the repeater output word, the bit repeater 53 begins a new repeater output word and places any copies of the current input bit not previously placed in a bit of the prior repeater output word on the first bits of the new repeater output word. The bit repeater 53 may repeat bits in a consecutive, concurrent, or hybrid manner.

In the block 210, the process transmits bits serially. Depending on which block precedes the process entering the block 210, the bits transmitted may correspond to the received parallel data or to repeated versions thereof. The process may supply the serialized data to, for example, a fiber optic cable. The process then continues to a block 212.

The processing of block 210 may be performed by the high-speed serializer 51 of the embodiment of FIG. 1. The high-speed serializer 51 time-division multiplexes the repeated parallel signals from the bit repeater 53 to produce the serial output signal. The high-speed serializer's multiplexing of values to the serial output signal may overlap in time with the bit repeater's repetition of bits for the same repeater input word. Furthermore, both the bit repeater 51 and the high-speed serializer 53 may include delays between their respective inputs and outputs that exceed the delays required for causality. For example, there may be pipeline registers to facilitate operation at high speeds.

The high-speed serializer 51 receives repeater output words from the bit repeater 53 at a rate of the repetition factor N times the repeater input word rate corresponding to a selected data rate. The bit rate at the high-speed serializer output is a multiplexing factor M times the word rate at the input of high-speed serializer. Thus, the high-speed serializer 51 operates with an output bit rate that is M times N times the input word rate of the serialization associated circuitry 52 corresponding to a preferred data rate of the high-speed serializer. Since the output bits from the high-speed serializer 51 are repeated in groups of N bits, the apparent bit rate of the serial output signal is, as desired, M times the input word rate. Accordingly, by utilizing different repetition rates, the transmit path 50 operates over a wide range of frequencies without the high-speed serializer 51 operating over a correspondingly wide range of frequencies.

In the block 212, the process checks whether it should exit. Whether the process should exit may be based, for example, on a control input to the process or on data values such as an end-of-frame signal previously serialized. If the process should exit, the process returns; otherwise, the process continues back to the block 204.

Figure 3:
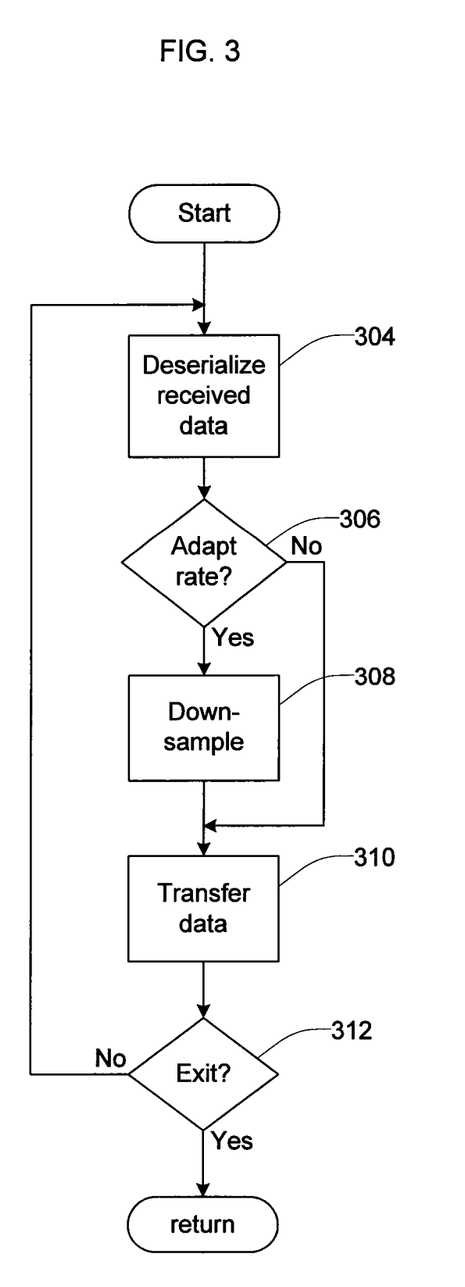
FIG. 3 is a flowchart of a deserialization process in accordance with aspects of the invention.

FIG. 3 is a flowchart of a deserialization process in accordance with aspects of the invention. In various embodiments, the process may be performed by the circuitry of FIG. 1, custom circuitry, programmable circuits, or a combination thereof. In many embodiments, the process is implemented by continuously running circuitry with data flowing through different portions of the circuitry as different times. The process may be initiated, for example, by a signal detector, such as an optical power sensor, or by application of power to circuitry performing the process. In a block 304, the process demultiplexes serial data received on an input. The demultiplexing converts the serial data into a corresponding parallel form. The serial data may come from, for example, a fiber optic link. The process then continues to a block 306.

The processing of block 304 may be performed by the high-speed deserializer 51 of the embodiment of FIG. 1. The high-speed deserializer 51 supplies words to the downsampler 63 at a rate of the repetition factor N times the selected data rate. The sampled bit rate at the input of the high-speed deserializer is a multiplexing factor M times the word rate at the output of high-speed deserializer. Thus, the high-speed deserializer 61 operates with an input bit rate that is M times N times the selected data rate of the output of the deserialization associated circuitry 62. Since the input bits of the high-speed deserializer 61 are repeated in groups of N bits, the apparent bit rate of the serial input signal is, as desired, M times the selected output word rate. Accordingly, by utilizing different downsampling rates, the receive path 60 is able to operate over a wide range of frequencies without the high-speed deserializer 61 operating over a correspondingly wide range of frequencies.

The high-speed deserializer 61 demultiplexes the serial input signal at the preferred data rate of the high-speed deserializer 61 to produce the parallel deserialized signals. The preferred data rate may be the signaling rate of the serial input signal or an integer multiple of the signaling rate of the serial input signal. The rate of demultiplexing by the high-speed deserializer 61 may be performed over a narrow range of frequencies, for example, one octave.

In the block 306, the process checks whether it should adapt the data rate. Whether the data rate should be adapted may be based on a control input to the process. For example, a control signal may have a value of one when the data rate is not to be adapted and a larger value when the data rate is to be adapted. If the data rate should be adapted, the process continues to a block 308; otherwise, the process continues to a block 310.

In the block 308, the process downsamples the received data to adapt the data rate. In one embodiment, the process selects every N-th bit from received parallel data, where N is the down-sampling ratio. The down-sampling ratio may be based on a control input to the process, for example, a control signal used in the block 306 may have a value signaling the down-sampling ratio. The process then continues to the block 310.

The processing of block 308 may be performed by the downsampler 63 of the embodiment of FIG. 1. The downsampler 63 receives the parallel deserialized signals from the high-speed deserializer 61 as groups of associated values which may be considered to form downsampler input words. The downsampler 63 receives a new downsampler input word at regular intervals depending on the preferred rate of the high-speed deserializer 61. Similarly, the downsampler 63 produces the parallel received signals as groups of associated values which may be considered to form downsampler output words. The downsampler 63 produces a new downsampler output word at regular intervals depending on the selected data rate. The downsampler 63 produces a downsampler output word for every repetition factor number of downsampler input words.

The downsampler 63 produces the parallel received signals by selecting every N-th, where N is the repetition factor, bit from the downsampler input words. When N equals 1, the downsampler 63 supplies the values from the downsampler input words, bit for bit, to the parallel received signals. N equals 1 corresponds to the case when the process does not adapt the data rate. When N is greater than one, the bits the downsampler 63 supplies to the parallel received signals are selected from a logical concatenation of N downsampler input words. The downsampler 63 may select bits in a consecutive, concurrent, or hybrid manner.

In the block 310, the process transfers parallel data to a data sink, for example, a communication network switch. Depending on which block precedes the process entering the block 310, the transferred data may be correspond to the deserialized received data or to downsampled versions thereof. The process then continues to a block 312.

In the block 312, the process checks whether it should exit. Whether the process should exit may be based, for example, on a control input to the process or on data values previously deserialized, such as an end-of-frame signal. If the process should exit, the process returns; otherwise, the process continues back to the block 304.

Figure 4:
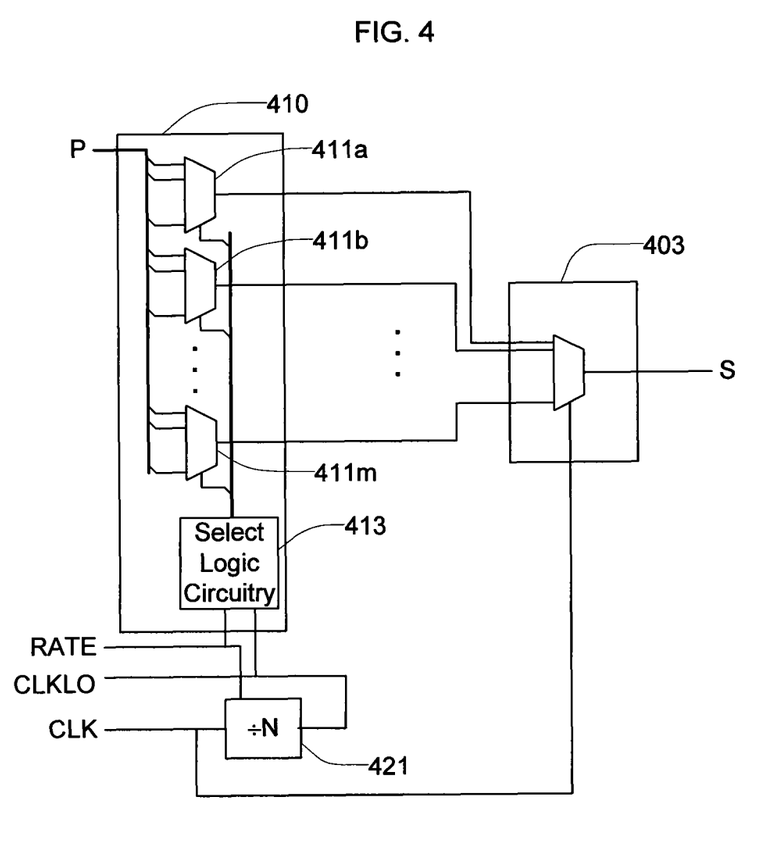
FIG. 4 is a schematic diagram of a serializer in accordance with aspects of the invention.

FIG. 4 is a schematic diagram of an embodiment of a serializer in accordance with aspects of the invention. The serializer includes a high-speed serializer 403 and a bit repeater 410. Some embodiments include a clock divider 421. The serializer receives an input clock signal CLK and parallel input signals P on parallel signal lines, which may be in the form of an input bus. The serializer time-division multiplexes the input signals to produce a serial output signal S. The parallel input signals P generally carry an M-bit digital signal. In many embodiments the bits are binary. The value of M is, in some embodiments, chosen based on the data coding used. For example, for communication links using 8B10B coding, M may equal ten with the serializer performing 10-to-1 multiplexing.

The data rate for the parallel input signals P is at a selected data rate, and the selected data rate may be any of a plurality of data rates. However, preferably the high-speed serializer operates at only a single data rate, the highest data rate of the plurality of data rates or some higher rate. The serializer effects operation over a broad range of data rates by upsampling, or repeating, input data to adapt the selected data rate of the parallel input signals to the preferred data rate of the high-speed serializer and then serializing the repeated data at a high data rate. The repetition factor may be indicated by a rate control signal RATE. In some embodiments, the rate control signal RATE signals power-of-two values, for example, 1, 2, 4, 8, 16, and 32. The value of the rate control signal RATE may be based, for example, on a configuration of an associated communication link or on an input data rate.

The bit repeater 410 receives the rate control signal RATE for use in configuring how the bit repeater 410 produces intermediate data signals X. When the rate control signal RATE has a value N, the bit repeater supplies N repetitions of each input value to the intermediate data signals X, where N is a positive integer. For example, in a serializer performing 5-to-1 serialization with rate N equals four, an input with values (D0 D1 D2 D3 D4) in parallel will be upsampled to four sets of parallel values (D0 D0 D0 D0 D1), (D1 D1 D1 D2 D2), (D2 D2 D3 D3 D3), and (D3 D4 D4 D4 D4) for serialization by the high-speed serializer 403.

The high-speed serializer 403 receives the input clock signal CLK and the intermediate data signals X produced by the bit repeater 410. The high-speed serializer 403 receives new values on the intermediate data signals X on each cycle of the input clock signal CLK. The high-speed serializer 403 multiplexes each bit received on the intermediate data signals X to produce the serial output signal S.

The clock divider 421, when present in an embodiment, receives the input clock signal CLK and the rate control signal RATE and produces an output clock signal CLKLO. The clock divider 421 produces the output clock signal CLKLO by dividing the input clock signal CLK by N, as signaled by the value of the rate control signal RATE.

The bit repeater 410 receives the parallel input signals P, the input clock signal CLK, the output clock signal CLKLO, and the rate control signal RATE and produces the intermediate data signals X. New input values of the parallel input signals may be received on each cycle of the output clock signal CLKLO. The bit repeater repeats each bit received on the parallel input signals P on N, as indicated by the rate control signal RATE, bits of the intermediate data signals X. There are N cycles of the input clock signal CLK during each cycle of the output clock signal CLKLO. The bit repeater 410 produces N values on the intermediate data signals X for each value received on the parallel input signals P, one on each cycle of the input clock signal CLK. The upsampling places N copies of the first (to be serialized) bit of the parallel input signals P on the first (to be serialized) N bits of the intermediate data signals X. N copies of the next input bit are placed in the next N bits of the intermediate data signals X. Placing N copies of the next input bit on the next N bits of the intermediate data signals X continues until all of the input bits have been copied. When an input bit copy has been placed on the last bit of the intermediate data signals X, the bit repeater waits for the next cycle of the input clock signal CLK. At the next cycle, the bit repeater places any copies of the current input bit not previously placed on a bit of the intermediate data signals on the first bits of the intermediate data signals. The bit repeater 410 then continues placing N copies of the next input bit on the next N intermediate bits until the last input bit has been copied to the intermediate data signals.

In one embodiment, the bit repeater 410 includes select logic circuitry 413 and M selectors 411a-411m. The output of each of the selectors is coupled to a corresponding bit of the intermediate data signals X. Each selector receives the parallel input signals P and supplies one of the received signals to the selector output. The received signal supplied to the output is controlled by control signals from the select logic circuitry 413. The select logic circuitry 413 produces a control signal for each selector. In an embodiment with little-endian serialization, the selector control signals are produced according to sel(i)=$\lfloor$(i+Mt')/N$\rfloor$, where N is the rate control value and is a positive integer, M is the width of the input bus, i is a bit index with values 0 ... M−1, and t' is a time index with values repeatedly cycling through 0 ... N−1. Some embodiments may include flip-flops on the input signals, the output signals, intermediate signals, or a combination thereof to improve signal timing, particularly for high-speed operation.

The operation of the bit repeater may be further understood by considering the following examples. In each example, the parallel input signals are four bits wide and have values (D0 D1 D2 D3), with D0 being the first input bit to be output by the serializer. For rate N equals one, each input value is copied to one bit of the intermediate data signals resulting in a value of (D0 D1 D2 D3). For rate N equals two, each input value is copied to two bits of the intermediate data signals resulting in a first value of (D0 D0 D1 D1) and a second value of (D2 D2 D3 D3). For rate N equals three, each input value is copied to three bits of the intermediate data signals resulting in values of (D0 D0 D0 D1), (D1 D1 D2 D2), and (D2 D3 D3 D3). Note that after the first intermediate data value is formed, only one of three copies of input D1 has been placed on the intermediate data signals. Accordingly, the second intermediate data value begins with two copies of input D1. For rate N equals four, each input value is copied to four bits of the intermediate data signals resulting in values of (D0 D0 D0 D0), (D1 D1 D1 D1), (D2 D2 D2 D2), and (D3 D3 D3 D3). In this case, each of the intermediate data values has the corresponding input value copied in all positions. For rate N equals five, each input value is copied to five bits of the intermediate data signals resulting in values of (D0 D0 D0 D0), (D0 D1 D1 D1), (D1 D1 D2 D2), (D2 D2 D2 D3), and (D3 D3 D3 D3). Note that the number of times an input is copied exceeds the width of the intermediate data signals and the copies of each input extend over two values on the intermediate data signals.

Figure 5:
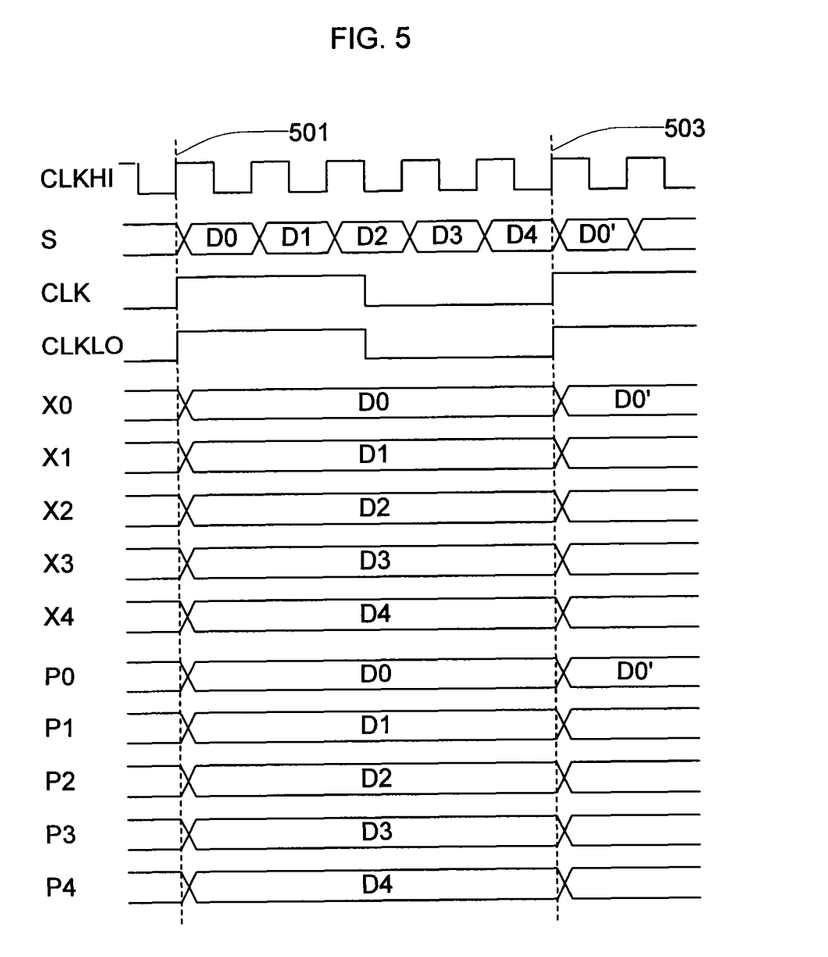
FIG. 5 is a timing diagram illustrating operation of a serializer in accordance with aspects of the invention.

Operation of the serializer may be further understood with reference to FIG. 5, an exemplary timing diagram for an upsampling rate, N, equal one. FIG. 5 shows timing of signals for a serialization ratio, M, equal five. FIG. 5 includes illustrative timing waveforms for a high-speed clock signal CLKHI used in the high-speed serializer 403, the serial output signal S, the input clock signal CLK, the intermediate data signals X0-X4, and the parallel input signals P0-P4. The timing relationships shown in FIG. 5 are simplified for ease of illustration. The shown delays between signals are zero or at least small in comparison to the clock periods, whereas the delays in a high-speed implementation may be more substantial and additional pipeline stages may be included. Additionally, the timing shown in FIG. 5 is for an embodiment that has signal transitions on the rising edges of the clock signals. Other embodiments may have signal transitions on falling edges or a combination of rising and falling edges.

A first time 501 is the beginning of a parallel input period during which values on the parallel input signals P are multiplexed on the serial output signal S. A second time 503 is the end of the parallel input period that began at the first time 501. At the first time 501, rising edges occur on the high-speed clock signal CLKHI, the input clock signal CLK, and the output clock signal CLKLO. One period of the output clock signal CLKLO spans from the first time 501 to the second time 503. Since N equals one, one period of the input clock signal CLK has substantially the same duration as one period of the output clock signal CLKLO. Accordingly, the output clock signal CLKLO has substantially the same waveform as the input clock signal CLK. Since M equals five, one period of the high-speed clock signal CLKHI has duration substantially one fifth the duration of one period of the input clock signal CLK.

From the first time 501 to the second time 503, that is, during one period of the output clock signal CLKLO, data values D0-D4 are present on the parallel input signals P. Since N equals one, beginning at the first time 501, the bit repeater 410 supplies the value D0 from the first bit of the parallel input signals P0 to the first bit of the intermediate data signals X0, the value D1 from the second bit of the parallel input signals P1 to the second bit of the intermediate data signals X1, the value D2 from the third bit of the parallel input signals P2 to the third bit of the intermediate data signals X2, the value D3 from the fourth bit of the parallel input signals P3 to the fourth bit of the intermediate data signals X3, and the value D4 from the fifth bit of the parallel input signals P4 to the fifth bit of the intermediate data signals X4. In effect, the bit repeater, for N equal one, duplicates the values on the parallel input signals P bit-for-bit on the intermediate data signals X.

The high-speed serializer 403 multiplexes a bit value from the intermediate data signals X to the serial output signal S during each period of the high-speed clock signal CLKHI. Thus, during the five periods of the high-speed clock signal CLKHI in the period of the output clock signal CLKLO from the first time 501 to the second time 503, the serial output signal S has values D0, D1, D2, D3, D4 in sequence and the values from the parallel input signals P have been multiplexed serially on the serial output signal S.

Figure 6:
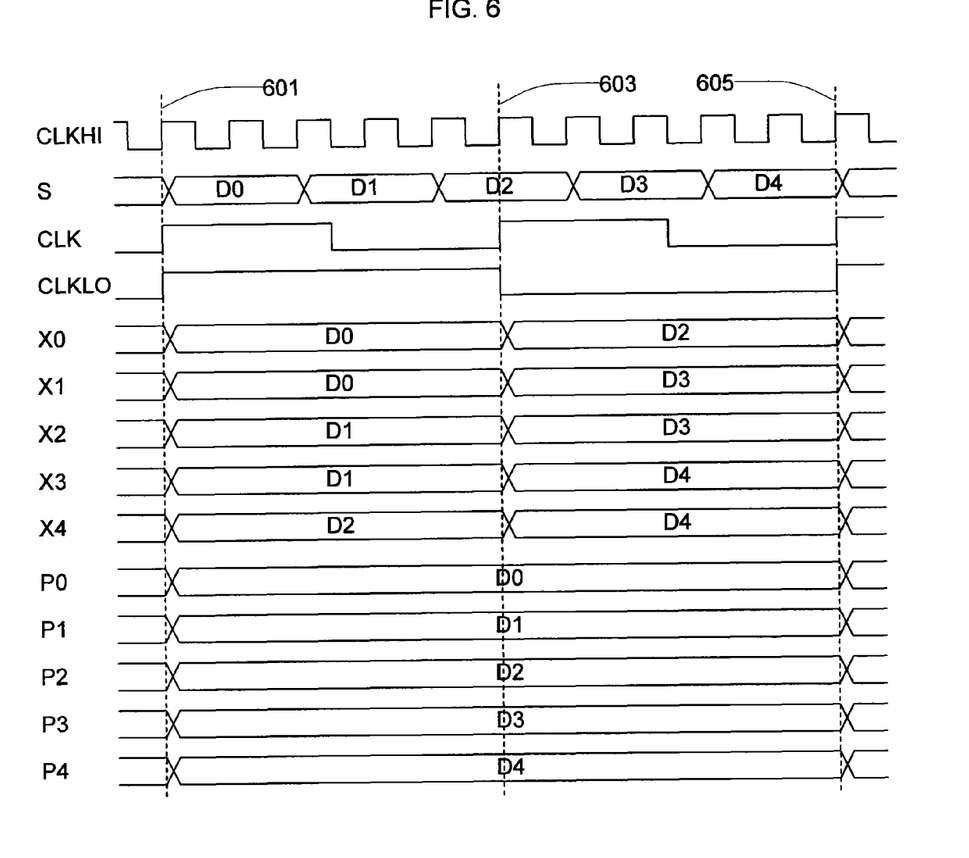
FIG. 6 is another timing diagram illustrating operation of a serializer in accordance with aspects of the invention.

Operation of the serializer may be further understood with reference to FIG. 6, an exemplary timing diagram for an upsampling rate, N, equal two. FIG. 6 shows timing of signals for a serialization ratio, M, equal five. FIG. 6 includes illustrative timing waveforms for a high-speed clock signal CLKHI used in the high-speed serializer 403, the serial output signal S, the input clock signal CLK, the intermediate data signals X0-X4, and the parallel input signals P0-P4. The timing relationships shown in FIG. 6 are simplified for ease of illustration. The shown delays between signals are zero or at least small in comparison to the clock periods, whereas the delays in a high-speed implementation may be more substantial and additional pipeline stages may be included. Additionally, the timing shown in FIG. 6 is for an embodiment that has signal transitions on the rising edges of the clock signals. Other embodiments may have signal transitions on falling edges or a combination of rising and falling edges.

A first time 601 is the beginning of a parallel input period during which values on the parallel input signals P are shifted serially on the serial output signal S. A second time 605 is the end of the parallel input period that began at the first time 601. At the first time 601, rising edges occur on the high-speed clock signal CLKHI, the input clock signal CLK, and the output clock signal CLKLO. One period of the output clock signal CLKLO spans from the first time 601 to the second time 605. Since N equals two, one period of the input clock signal CLK has a duration that is substantially one half the duration of one period of the output clock signal CLKLO. Since M equals five, one period of the high-speed clock signal CLKHI has substantially one fifth the duration of one period of the input clock signal CLK. Accordingly, at a third time 603, which is at the midpoint of the parallel input period beginning at the first time 601, rising edges occur on the high-speed clock signal CLKHI and the input clock signal CLK and a falling edge occurs on the output clock signal CLKLO.

From the first time 601 to the second time 605, that is, during one period of the output clock signal CLKLO, data values D0-D4 are present on the parallel input signals P. Since N equals two, beginning at the first time 601, the bit repeater 410 supplies the value D0 from the first bit of the parallel input signals P0 to the first two bits of the intermediate data signals X0, X1, the value D1 from the second bit of the parallel input signals P1 to the next two bits of the intermediate data signals X2, X3, and the value D2 from the third bit of the parallel input signals P2 to the final bit of the intermediate data signals X4. Note that only one of two repetitions of the value D2 presently fits in the intermediate data signals, thus the second repetition will be placed in the intermediate data signals during a subsequent period of input clock signal CLK. The high-speed serializer 403 multiplexes a bit value from the intermediate data signals X to the output S during each period of the high-speed clock signal CLKHI. Thus, during the first five periods of the high-speed clock signal CLKHI after time 601, the output S has values D0, D0, D1, D1, D2, in sequence.

Beginning at the third time 603, that is, at the midpoint of the parallel input period and the beginning of a period of the input clock signal CLK, the bit repeater 410 supplies the value D2 from the third bit of the parallel input signals P2 to the first bit of the intermediate data signals X0, the value D3 from the fourth bit of the parallel input signals P3 to the next two bits of the intermediate data signals X1, X2, and the value D4 from the fifth bit of the parallel input signals P4 to the final two bits of the intermediate data signals X3, X4. The high-speed serializer 403 multiplexes a bit value from the intermediate data signals X to the serial output signal S during each period of the high-speed clock signal CLKHI. Thus, during the first five periods of the high-speed clock signal after time 603, the serial output signal S has values D2, D3, D3, D4, D4, in sequence.

During the parallel input period shown in FIG. 6 from the first time 601 to the second time 603, the high-speed serializer 403 multiplexed ten values to the serial output signal S. The ten values are made up of five values repeated for two consecutive periods of the high-speed clock signal CLKHI. When viewed at the boundary of the serializer, the upsampling and high-speed serialization produce a signal on the serial output signal S that matches the signal that would be produced by a serializer operating directly based on the parallel input rate.

Figure 7:
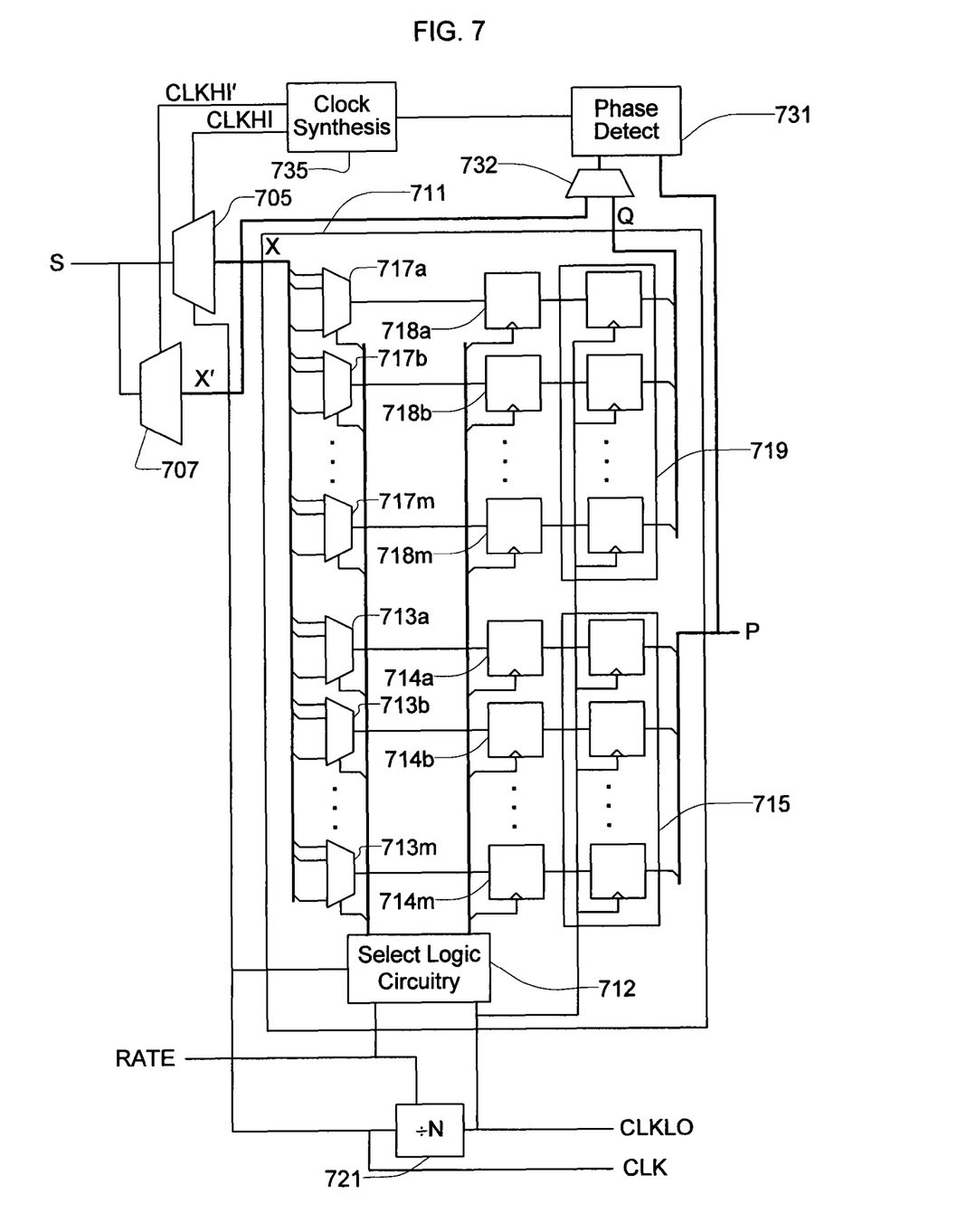
FIG. 7 is a schematic diagram of a deserializer in accordance with aspects of the invention.

FIG. 7 is a schematic diagram of an embodiment of a deserializer in accordance with aspects of the invention. The deserializer includes a clock synthesizer 735, a pair of high-speed deserializers 705, 707, a phase detector 731, and a downsampler 711. Some embodiments include a clock divider 721. The deserializer receives a stream of serial data on a serial input signal S and produces a parallelized version of the received data on parallel output signals P. The parallel output signals P generally carry an M-bit digital signal.

The data rate for the parallel output signals P is at a selected data rate, and the selected data rate may be any of a plurality of data rates. However, preferably the high-speed deserializers operate at only a single data rate, the highest data rate of the plurality of data rates. The deserializer effects operation over a broad range of data rates by deserializing the serial input signal S at the preferred data rate of the high-speed deserializers and downsampling the deserialized data to adapt to the selected data rate of the parallel output signals P. The downsampling factor may be indicated by a rate control signal RATE. In some embodiments, the rate control signal RATE signals power-of-two values, for example, 1, 2, 4, 8, 16, and 32. The value of the rate control signal RATE may be based, for example, on a configuration of an associated communication link or on an input data rate.

The clock synthesizer 735 generates two high-speed clock signals CLKHI, CLKHI' that are nominally 180 degrees out of phase. The first high-speed deserializer 705 receives the first high-speed clock signal CLKHI and uses it to deserialize data received on the serial input signal S. On each rising edge of the first high-speed clock signal CLKHI, the first high-speed deserializer 705 samples the value on the serial input signal S. M consecutive samples are assembled to produce first intermediate data signals X. The first high-speed deserializer 705 also produces a clock signal CLK that is synchronized to the first intermediate data signals X. The second high-speed deserializer 707 receives the second high-speed clock signal CLKHI' and uses it to deserialize data received on the serial input signal S. On each rising edge of the second high-speed clock signal CLKHI', the second high-speed deserializer 707 samples the value on the serial input signal S. M consecutive samples are assembled to produce second intermediate data signals X'. The two high-speed clock signals CLKHI, CLKHI' are generally adjusted as described below to be synchronous with the serial input signal S.

The clock divider 721, when present in an embodiment, receives the clock signal CLK from the first high-speed deserializer 705 and the rate control signal RATE and produces an output clock signal CLKLO. Values of the rate control signal RATE may be positive integers. In some embodiments, the rate control signal RATE signals power-of-two values, for example, 1, 2, 4, 8, 16, and 32. The clock divider 721 produces the output clock signal CLKLO by dividing the input clock signal CLK by N, as specified by the value of the rate control signal RATE.

The downsampler 711 receives the first intermediate data signals X, the clock signal CLK, and the rate control signal RATE and produces the parallel output signals P and timing signals Q. The downsampler downsamples values received on the first intermediate data signals X by a factor of N as specified by the rate control signal RATE. One set of values on the parallel output signals P is produced for N sets of values on the first intermediate data signals X. The first bit of the first values on the first intermediate data signals is placed on the first bit of the parallel output signals P. The N-th next bit (skipping N–1 bits) of the values on the first intermediate data signals is placed on the next bit position of the parallel output signals P. This mapping continues until a bit has been placed on all bit positions of the parallel output signals P. When an insufficient number of bits are left in the values on the first intermediate data signals to reach an N-th next bit, the remaining bits are taken from a next set of values on the first intermediate data signals. For example, if the sixth next bit was needed and only two bits remained on the first intermediate data signals, the downsampler would then select the fourth bit value from the next set of values on the first intermediate data signals. This mapping may be viewed as concatenating N sets of values from the first intermediate data signals X and placing every N-th bit of the concatenated values on the parallel output signals P.

The downsampler 711 also selects values from the first intermediate data signals X for use by the phase detector. The selected values produce the timing signals Q. The values mapped from the first intermediate data signals X to the timing signals Q are half way between the values mapped to the parallel output signals P. For example, for rate N equals four, when bit zero and bit four from the first intermediate data signals X are mapped to the parallel output signals P, bit two from the first intermediate data signals X is mapped to the timing signals Q. For rate N equals one, no values on the first intermediate data signals X are half way between the values mapped to the parallel output signals P. In this case, the values on the timing signals Q are not used and the downsampler 711 may place arbitrary values on the timing signals, for example, copies of the values on the parallel output signals P or zeros.

The phase detector 731 receives values from the parallel output signals P and the timing signals Q and supplies a signal to the clock synthesizer 735 that may be used to adjust the frequency of the high-speed clock signals CLKHI, CLKHI'. The phase detector, clock synthesizer, high-speed deserializer, and downsampler operate in a closed-loop manner to sample the received signal at desired times. The phase detector 731 may be an Alexander-type phase detector. However, the phase detector 731 generally performs parallel phase detections for each of the parallel input signals P. In some embodiments, the phase detector 731 uses a majority vote of individual phase detections to produce the signal supplied to the clock synthesizer 735. For rate N equals one operation, the phase detector uses values from the second high-speed serializer 707 rather than the values from the timing signals Q. The values of the second intermediate data signals X' are samples of the signals on the serial input signal S that are half way in time between values of the parallel output signals P due to the 180 degree phase difference between the two high-speed clock signals CLKHI, CLKHI'. The values to be used by the phase detector are selected by a selector 732. In some embodiments, the phase detector 731 may use the rate control signal RATE in adjusting the gain of the phase detector in accord with an expected data transition density.

In one embodiment, the downsampler 711 includes select logic circuitry 712, M data selectors 713a-m, M data flip-flops 714a-m, an M-bit data register 715, M timing selectors 717a-m, M timing flip-flops 718a-m, and an M-bit timing register 719.

Each of the data selectors 713a-m has an output that is coupled to an input of a corresponding data flip-flop 714a-m. Each selector receives bits from the first intermediate data signals X and routes one of the received bits to the selector's output. The bit selected is controlled by control signals from the select logic circuitry 712. Each data flip-flop 714a-m has an output coupled to a corresponding input of the data register 715. When a data flip-flop will be enabled to store its input is controlled by enable signals from the select logic circuitry 712. The data register 715 stores the values on its inputs and passes them to its outputs based on the output clock signal CLKLO. The outputs of the data register 715 are coupled to the output signals P. In an embodiment with little-endian serialization, the data selector control signals are produced according to $sel(i)=Ni \, MOD \, M$ and the data enable signals are produced according to $en(i)=t'=\lfloor Ni/M \rfloor$, where N is the rate control value having values 1, 2, 4, 6, etc., M is the width of the parallel signals, i is a bit index with values $0 \ldots M-1$, and t' is a time index with values cycling repeatedly through $0 \ldots N-1$.

Each of the timing selectors 717a-m has an output that is coupled to an input of a corresponding timing flip-flop 718a-m. Each selector receives bits from the first intermediate data signals X and routes one of the received bits to the selector's output. The bit selected is controlled by control signals from the select logic circuitry 712. Each timing flip-flop 718a-m has an output coupled to corresponding input of the timing register 719. When a timing flip-flop will be enabled to store its input is controlled by enable signals from the select logic circuitry 712. The timing register 719 stores the values on its inputs and passes them to its outputs based on the output clock signal CLKLO. The outputs of the timing register 719 are coupled to the timing signals Q. In an embodiment with little-endian serialization, the timing selector control signals are produced according to $sel(i)=N(i+\frac{1}{2}) \, MOD \, M$ and the timing enable signals are produced according to $en(i)=t'=\lfloor N(i+\frac{1}{2})/M \rfloor$, where N is the rate control value having values 1, 2, 4, 6, etc., M is the width of the parallel signals, i is a bit index with values $0 \ldots M-1$, and t' is a time index with values cycling repeatedly through $0 \ldots N-1$.

Figure 8:
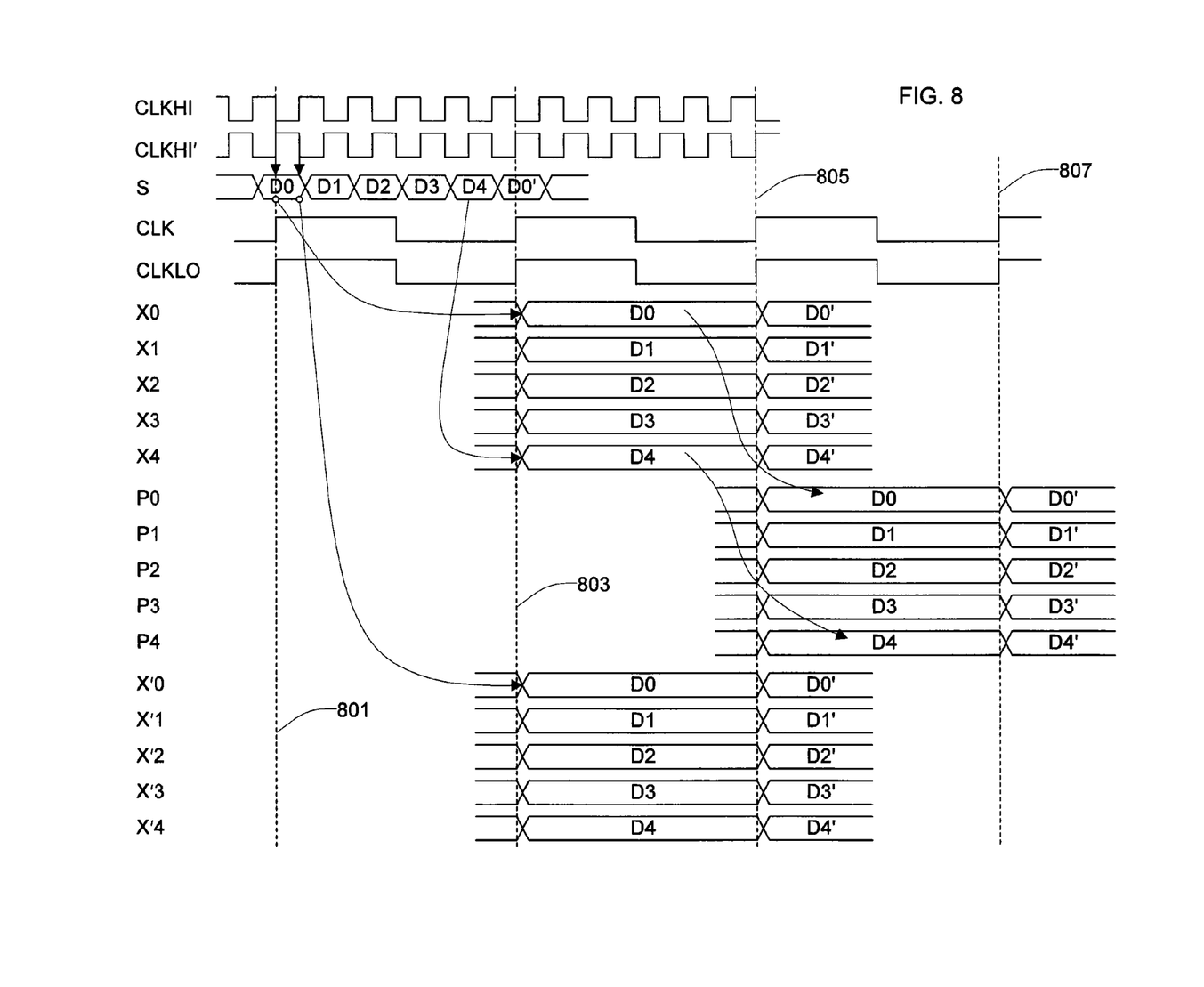
FIG. 8 is a timing diagram illustrating operation of a deserializer in accordance with aspects of the invention.

Operation of the deserializer according to aspects of the invention may be further understood with reference to FIG. 8, an exemplary timing diagram for a downsampling rate, N, equal one. FIG. 8 shows timing of signals for a serialization ratio, M, equal five. FIG. 8 includes illustrative timing waveforms for the two high-speed clock signals CLKHI, CLKHI', the serial input signal S, the clock signal CLK, the output clock signal CLKLO, the first intermediate data signals X0-X4, the second intermediate data signals X'0-X'4, and the parallel output signals P0-P4. The timing relationships shown in FIG. 8 are simplified for ease of illustration. The shown delays between signals are zero or at least small in comparison to the clock periods, whereas the delays in a high-speed implementation may be more substantial and additional pipeline stages may be included. Additionally, the timing shown in FIG. 8 is for an embodiment that has signal transitions on the rising edges of the clock signals. Other embodiments may have signal transitions on falling edges or a combination of rising and falling edges.

A first time 801 is the beginning of an input period containing one set of associated values received by the deserializer on the serial input signal S. A second time 803 is the end of the input period that began at the first time 801. At the first time 801, rising edges occur on the first high-speed clock signal CLKHI, the clock signal CLK, and the output clock signal CLKLO and a falling edge occurs on the second high-speed clock signal CLKHI'. One period of the output clock signal CLKLO spans from the first time 801 to the second time 803. Since N equals one, one period of the clock signal CLK has duration substantially the same as one period of the output clock signal CLKLO. Accordingly, the output clock signal CLKLO has substantially the same waveform as the clock signal CLK. Since M equals five, five periods of the high-speed clock signals CLKHI, CLKHI' have a combined duration that is substantially the same as one period of the clock signal CLK. Another input period begins at the second time 803 and extends to a third time 805. Another input period begins at the third time 805 and extends to a fourth time 807.

On the rising edge of the first high speed clock signal CLKHI occurring at the first time 803, the first high speed deserializer 705 samples a value on the serial input signal S. The first high speed deserializer 705 continues to sample values on the serial input signal S on each subsequent rising edge of the first high speed clock signal CLKHI. After M samples have been taken, they are placed on the first intermediate data signals X at the second time 803.

On the first rising edge of the second high speed clock signal CLKHI' occurring after the first time 803, the second high speed deserializer 707 samples a value on the serial input signal S. The second high speed deserializer 707 continues to sample values on the serial input signal S on each subsequent rising edge of the second high speed clock signal CLKHI'. After M samples have been taken, they are placed on the second intermediate data signals X' at the second time 803. In the timing illustrated in FIG. 8 the high-speed clock signals CLKHI, CLKHI' are early relative to the data of the serial input signal S, that is, rising edges of the first high-speed clock signal CLKHI occur before the middle of the times during which data are valid on the serial input signal S. Accordingly, the values output from the first and second high-speed deserializers match.

During the input period extending from the second time 803 to the third time 805, the downsampler 711 downsamples the values on the first intermediate data signals X by a factor N. In the timing example illustrated in FIG. 8, N equals one and the downsampler places values on the first intermediate data signals X bit-for-bit on the parallel output signals P beginning at the third time 805 and extending until the fourth time 807. During this same time, the data values sampled by the two high-speed deserializers 705, 707 are supplied to the phase detector 731 for use in adjusting sample timing.

Figure 9:
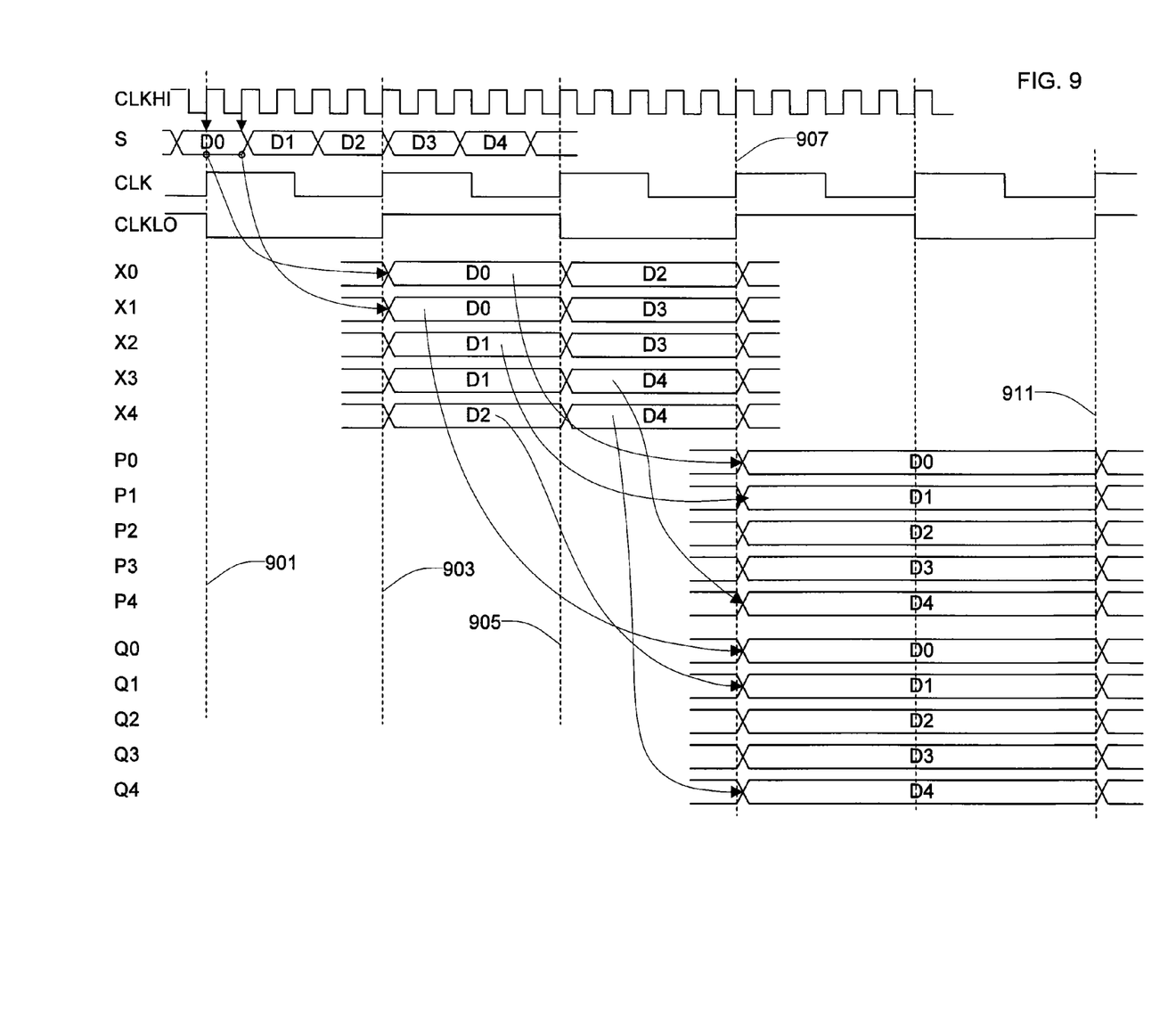
FIG. 9 is another timing diagram illustrating operation of a deserializer in accordance with aspects of the invention.

Operation of the deserializer according to aspects of the invention may be further understood with reference to FIG. 9, an exemplary timing diagram for a downsampling rate, N, equal two. FIG. 9 shows timing of signals for a serialization ratio, M, equal five. FIG. 9 includes illustrative timing waveforms for the first high-speed clock signal CLKHI, the serial input signal S, the input clock signal CLK, the output clock signal CLKLO, the first intermediate data signals X0-X4, the timing signals Q0-Q4, and the parallel output signals P0-P4. The timing relationships shown in FIG. 9 are simplified for ease of illustration. The shown delays between signals are zero or at least small in comparison to the clock periods, whereas the delays in a high-speed implementation may be more substantial and additional pipeline stages may be included. Additionally, the timing shown in FIG. 9 is for an embodiment that has signal transitions primarily on the rising edges of the clock signals. Other embodiments may have signal transitions on falling edges or a combination of rising and falling edges.

A first time 901 is the beginning of an input period containing one set of associated values received by the deserializer on the serial input signal S. A second time 905 is the end of the input period that began at the first time 901. At the first time 901, rising edges occur on the first high-speed clock signal CLKHI and the clock signal CLK and a falling edge occurs on the output clock signal CLKLO. One period of the output clock signal CLKLO spans from the first time 901 to the second time 905. Since N equals two, two periods of the clock signal CLK have a combined duration that is substantially the same as the duration of one period of the output clock signal CLKLO. Accordingly, at a third time 903 midway between the first time 901 and the second time 905 a rising edge occurs on the clock signal CLK and a falling edge on the output clock signal CLKLO. Since M equals five, five periods of the first high-speed clock signal CLKHI have a combined duration that is substantially the same as the duration of one period of the clock signal CLK. A period of the output clock signal CLKLO begins at the third time 903 and ends at a fourth time 907. Another period of the output clock signal CLKLO begins at the fourth time 907 and ends at a fifth time 911.

On the rising edge of the first high speed clock signal CLKHI occurring at the first time 901, the first high speed deserializer 905 samples the value on the serial input signal S. The first high speed deserializer 905 continues to sample the values on the serial input signal S on each subsequent rising edge of the first high speed clock signal CLKHI. After M samples have been taken, they are placed on the first intermediate data signals X at the third time 903.

On the rising edge of the first high speed clock signal CLKHI occurring at the third time 903, the first high speed deserializer 905 samples another value on the serial input signal S. The first high speed deserializer 905 continues sampling values on the serial input signal S on each subsequent rising edge of the first high speed clock signal CLKHI. After M samples have been taken, they are placed on the first intermediate data signals X at the second time 905.

During the period of the output clock signal CLKLO from the third time 903 to the fourth time 907, the downsampler 711 selects values from the first intermediate data signals X to place on the parallel output signals P and on the timing signals Q. Since N equals two, two sets of values are on the first intermediate data signals X during each period of the output clock signal CLKLO. Following from the above description of downsampling, from the first set of values on the intermediate data signals X, the values from the first (X0), third (X2), and fifth (X4) bits are placed by the deserializer 711 on the first three bits of the output signals P0, P1, P2, and from the second set of values of the intermediate data signals X, the values from the second (X1) and fourth (X3) bits are placed on the final two bits of the output signals P3, P4. Similarly, from the first set of values on the intermediate data signals X, the values from the second (X1) and fourth (X3) bits are placed on the first two bits of the timing signals Q0, Q1 and from the second set of values on the intermediate data signals X, the values from the first (X0), third (X2), and fifth (X4) bits are placed on the final three bits of the timing signals Q2, Q3, Q4. The deserializer holds values on the output signals P and the timing signals Q for one period of the output clock signal CLKLO.

Although the invention has been discussed with respect to various embodiments, it should be understood the invention comprises the novel and unobvious claims, and their insubstantial variations, supported by this disclosure.

The invention claimed is:

1. An integrated circuit comprising:
high-speed serializer circuitry configured to operate at a data rate at least as fast as the fastest of a plurality of different selectable data rates;
bit repeater circuitry configured to receive repeater input words, produce N copies of each bit of the repeater input words in consecutive bit positions of repeater output words, where the consecutive bit positions wrap over multiple repeater output words, and supply the repeater output words to the high-speed serializer circuitry at the operating data rate of the high-speed serializer circuitry, wherein N is an integer greater than 1;
high-speed deserializer circuitry configured to operate at the data rate at least as fast as the fastest of the plurality of different selectable data rates; and
downsampler circuitry configured to receive downsampler input words from the high-speed deserializer circuitry at the operating data rate of the high-speed deserializer circuitry, produce parallel received signals, where the parallel received signals are selected from a logical concatenation of N downsampler input words, and supply the parallel received signals at a selected one of the plurality of different selectable data rates.

2. The integrated circuit of claim 1, wherein N is proportional to the ratio of the operating data rate of the high-speed serializer circuitry and the selected one of the plurality of different selectable data rates.

3. The integrated circuit of claim 1, wherein the parallel received signals are selected from every N-th bit of the logical concatenation of the N downsampler input words, where N is the ratio of the operating data rate of the high-speed deserializer circuitry and the selected one of the plurality of different selectable data rates.

4. The integrated circuit of claim 1, further comprising receive processing circuitry configured to receive the parallel received signals from the downsampler circuitry and supply processed signals at the selected one of the plurality of different selectable data rates.

5. The integrated circuit of claim 1, further comprising transmit processing circuitry configured to receive input data and supply the repeater input words to the bit repeater circuitry at the selected one of the plurality of different selectable data rates.

6. The integrated circuit of claim 1, wherein the repeater input words received by the bit repeater circuitry comprises parallel data signals.

7. The integrated circuit of claim 1, wherein the repeater output words supplied by the bit repeater circuitry to the high-speed serializer circuitry comprises parallel data signals.

8. The integrated circuit of claim 7, wherein the high-speed serializer circuitry is further configured to produce a serial output signal utilizing the repeater output words supplied by the bit repeater circuitry.

9. The integrated circuit of claim 1, wherein the downsampler input words supplied by the high-speed deserializer circuitry to the downsampler circuitry comprises parallel data signals.

10. The integrated circuit of claim 9, wherein the high-speed deserializer circuitry is further configured to produce the downsampler input words supplied to the downsampler circuitry utilizing a received serial input signal.

11. The integrated circuit of claim 1, wherein the parallel received signals supplied by the downsampler circuitry comprises parallel data signals.

12. The integrated circuit of claim 1, wherein the number of copies, N, of each bit of the repeater input words is indicated by a rate control signal.

13. The integrated circuit of claim 1, further comprises a FIFO to rate buffer the repeater input words.

14. The integrated circuit of claim 13, further comprises an encoder to receive the rate buffered repeater input words and encode the rate buffered repeater input words using 8B10B code.

15. The integrated circuit of claim 1, further comprises an aligner to receive the parallel received signals and supply aligned signals.

16. The integrated circuit of claim 15, further comprises a decoder to decode the aligned signals using 8B10B code.

* * * * *